United States Patent
Dandl et al.

(10) Patent No.: US 12,306,262 B2
(45) Date of Patent: May 20, 2025

(54) DETECTION OF ABNORMAL SELF-DISCHARGE OF LITHIUM ION CELLS, AND BATTERY SYSTEM

(71) Applicant: Bayerische Motoren Werke Aktiengesellschaft, Munich (DE)

(72) Inventors: Sonia Dandl, Munich (DE); Sebastian Scharner, Tuerkenfeld (DE); Jan Philipp Schmidt, Holzmaden (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 802 days.

(21) Appl. No.: 17/280,012

(22) PCT Filed: Aug. 19, 2019

(86) PCT No.: PCT/EP2019/072171
§ 371 (c)(1),
(2) Date: Mar. 25, 2021

(87) PCT Pub. No.: WO2020/064221
PCT Pub. Date: Apr. 2, 2020

(65) Prior Publication Data
US 2021/0396817 A1    Dec. 23, 2021

(30) Foreign Application Priority Data
Sep. 25, 2018   (DE) .................... 10 2018 216 356.1

(51) Int. Cl.
*G01R 31/396*    (2019.01)
*B60L 58/12*     (2019.01)
(Continued)

(52) U.S. Cl.
CPC ............ *G01R 31/396* (2019.01); *B60L 58/12* (2019.02); *G01R 31/389* (2019.01);
(Continued)

(58) Field of Classification Search
CPC .. G01R 31/396; G01R 31/389; G01R 31/392; B60L 58/12; B60L 58/22; H02J 7/0048;
(Continued)

(56) References Cited

U.S. PATENT DOCUMENTS 8,203,306 B2   6/2012  Nishiyama et al.
9,472,962 B2  10/2016  Brun-Buisson et al.
(Continued)

FOREIGN PATENT DOCUMENTS

CN   101997328 B   *  2/2013
JP   2003-282155 A   10/2003

OTHER PUBLICATIONS

English translation of JP2003282155, Oct. 2003. (Year: 2003).*
(Continued)

*Primary Examiner* — Michael P Nghiem
(74) *Attorney, Agent, or Firm* — Crowell & Moring LLP

(57) ABSTRACT

A method for detecting abnormal self-discharge in a battery system by monitoring the balancing charge for each cell and a battery system which is configured to use this method are provided. The method makes it possible to predict the probability of the occurrence of a safety-critical state, for example, an internal short circuit, with the result that suitable countermeasures can be taken in good time.

5 Claims, 3 Drawing Sheets

(51) Int. Cl.
  *G01R 31/389* (2019.01)
  *G01R 31/392* (2019.01)
  *H01M 10/42* (2006.01)
  *H01M 10/44* (2006.01)
  *H02J 7/00* (2006.01)

(52) U.S. Cl.
  CPC ........ *G01R 31/392* (2019.01); *H01M 10/425* (2013.01); *H01M 10/441* (2013.01); *H02J 7/0014* (2013.01); *H02J 7/0048* (2020.01); *H01M 2010/4271* (2013.01); *H01M 2220/20* (2013.01)

(58) Field of Classification Search
  CPC .. H02J 7/0014; H01M 10/425; H01M 10/441; H01M 2010/4271; H01M 2220/20
  USPC .......................................................... 702/63
  See application file for complete search history.

(56) References Cited

U.S. PATENT DOCUMENTS

| | | | |
|---|---|---|---|
| 2008/0303527 A1 | 12/2008 | Fechalos et al. | |
| 2009/0023053 A1 | 1/2009 | Berdichevsky et al. | |
| 2011/0181246 A1 | 7/2011 | Tae et al. | |
| 2011/0267005 A1* | 11/2011 | Gollob | H02J 7/0014 320/116 |
| 2012/0182021 A1 | 7/2012 | McCoy et al. | |
| 2012/0249189 A1* | 10/2012 | Frattini | H03K 17/6872 327/109 |
| 2013/0065093 A1 | 3/2013 | White et al. | |
| 2013/0154567 A1* | 6/2013 | Peterson | H02J 7/0063 320/126 |
| 2019/0312443 A1* | 10/2019 | Estes | H01M 10/486 |
| 2022/0385079 A1* | 12/2022 | Schmidt | H02J 7/0016 |

OTHER PUBLICATIONS

English translation of CN 101997328, Feb. 27, 2013. (Year: 2013).*
International Search Report (PCT/ISA/210) issued in PCT Application No. PCT/EP2019/072171 dated Dec. 3, 2019 with English translation (six (6) pages).
German-language Written Opinion (PCT/ISA/237) issued in PCT Application No. PCT/EP2019/072171 dated Dec. 3, 2019 (six (6) pages).
German-language Search Report issued in German Application No. 10 2018 216 356.1 dated Jun. 18, 2019 with partial English translation (14 pages).

* cited by examiner

DETECTION OF ABNORMAL SELF-DISCHARGE OF LITHIUM ION CELLS, AND BATTERY SYSTEM

BACKGROUND AND SUMMARY OF THE INVENTION

Technical Field

The present invention relates to a method for detecting abnormal self-discharge of lithium ion cells in a battery system, and to a battery system which employs this method.

Technical Background

Battery System

Battery systems for electric or hybrid electric vehicles comprise a plurality of individual secondary cells which are mutually interconnected in parallel and in series, typically lithium ion cells, which are controlled by a battery management system (BMS).

The function of the BMS includes, inter alia, the monitoring of operating data such as the cell voltage, the state of charge (SoC), state of health (SoH), current and temperature, and control of the charging or discharging of cells. Further functions of the BMS include the thermal management of the battery system, the protection of cells and the prediction of the residual service life of cells, on the basis of operating data recorded.

Balancing

A key function of the BMS is "balancing," which involves the equalization of the state of charge of individual cells. It can occur that the state of charge (SoC) of individual cells deviates from the SoC of the remaining cells in a cell assembly, for example, as a result of increased self-discharging associated with an uneven temperature distribution or variations in manufacture. An imbalance of this type is perceptible in the form of the mutual divergence of cell voltages, and can result in a shortened service life and the increased wear of cells. Balancing involves the mutual equalization of the state of charge of cells, in order to restore an equilibrium.

A distinction is generally drawn between active and passive balancing methods. In active balancing methods, a charge is transmitted from a cell having an increased SoC to a cell having a lower SoC. This can be executed by means of a capacitor, a coil and/or a voltage converter. In passive balancing methods, conversely, in cells having an increased SoC, the surplus charge is simply dissipated by means of a resistor (shunt), until the state of charge is equalized.

Safety-Critical Operating States

A key reason for the widespread use of lithium ion cells is their high energy density. However, this high energy density simultaneously entails a potential for catastrophic damage in the event of a fault, for example a thermal runaway of the cell. It is therefore important that the BMS should be capable of the prompt detection of safety-critical states of a lithium ion cell, and of implementing appropriate countermeasures.

"Thermal runaway" can occur in the event that, as a result of an abnormally high current flux, for example, in response to an internal or external short-circuit, the cell temperature rises to the extent that the integrity of the separator can no longer be guaranteed, and initially local defects occur, for example, as a result of the localized deformation or localized melting of the separator such that, at these locations, the anode (reducing agent) and the cathode (oxidizing agent) enter into direct contact, or at least into electrically conductive contact. This permits a strongly exothermic localized redox reaction, which results in a further increase in temperature and the further destruction of the separator. The initially localized redox reaction can be propagated further, and a vaporization and breakdown of electrolytes can occur which, in turn, can result in a rupture of the housing, contact with atmospheric oxygen and, ultimately, fires or explosions.

The hazard of an external short-circuit can be counteracted, for example, by the fitting of a fuse. An internal short-circuit occurs where an electrically conductive connection between the anode and cathode is constituted in the interior of a cell. Internal short-circuits of this type can occur, on the one hand, as a result of a catastrophic external factor, for example, in response to a mechanical deformation of the cell or the penetration of a metal object further to an accident.

A further category of internal short-circuits can be caused by processes in the cell itself, for example, by metal particles which are enclosed in the cell as a result of a production defect and/or by the precipitation of metallic lithium in the form of "dendrites" on the anode, which "grow through" the separator and can constitute a conductive connection with the cathode. It is assumed that defects of this type will not immediately result in thermal runaway. It is thus assumed that, initially, dendrites will be very thin and will have a relatively low current-carrying capacity such that, in the event of a short-circuit, they will undergo a spontaneous breakdown.

However, if "soft" short-circuits of this type (also described hereinafter as "soft shorts") occur repeatedly, particularly at the same location (at which, for example, a metal particle or a weak point in the separator may be present), it can be assumed that an increasingly high-capacity bridge will be constituted between the anode and cathode, ultimately resulting in thermal runaway. Before this occurs, however, soft shorts would be expected to become noticeable as a result of increased self-discharging in the cell. Monitoring of self-discharging therefore constitutes a potential measure for the anticipation of the occurrence of a safety-critical state and the prompt implementation of appropriate countermeasures.

As a method for the monitoring of self-discharging, it is proposed, in US 2012/182021, that a differential current between two parallel-connected cells should be monitored, which is zero in the event that self-discharging is equal, and otherwise flows from the cell having low self-discharging to a cell having higher self-discharging.

Definition of Object

In consideration of the above-mentioned issue, the object of the present invention is the provision of a method for monitoring the self-discharging of lithium ion cells which can be integrated in an existing battery system, with a minimum complexity of equipment.

DETAILED DESCRIPTION OF THE DRAWINGS

The invention is based upon a concept whereby this object is fulfilled by employing the balancing function which, in any event, is present in the battery system.

The invention thus relates to a method for detecting abnormal self-discharge in a battery system by monitoring the battery charge per cell, and to a battery system which is configured for the employment of this method.

The method according to the invention permits a prediction of the probability of the occurrence of a safety-critical state such as an internal short-circuit, such that appropriate countermeasures can be implemented promptly.

Battery System and Balancing

The battery system in which the method according to the invention is employed comprises a plurality of lithium ion cells and a battery management device (also described hereinafter as a battery management system, or BMS), wherein the cells are respectively provided with a balancing circuit, either individually or in groups. The battery management device is designed to execute a charge equalization, i.e., a balancing operation, at predefined time points. To this end, in a cell or cell group, the cell voltage of which is raised in comparison with at least one other cell or cell group, the balancing circuit is actuated in order to draw charge from this cell or cell group and, optionally, to feed the charge thus drawn to another cell or cell group having a lower cell voltage, until the cell voltages are equalized.

Balancing is typically executed during a resting phase, for example, after charging, and a time point at which the battery system is not subject to any loading. If the battery system is installed in an electric vehicle, balancing can be executed at an arbitrary time point, other than during the operation of the vehicle, preferably directly after the charging of the energy store. In a hybrid electric vehicle or plug-in hybrid electric vehicle, operation of the vehicle with the combustion engine can also be considered. According to the invention, the time point and the exact method of balancing are not specifically limited, provided that, in the balancing operation, the charge transferred for each cell can be determined by the BMS.

Figure 1:
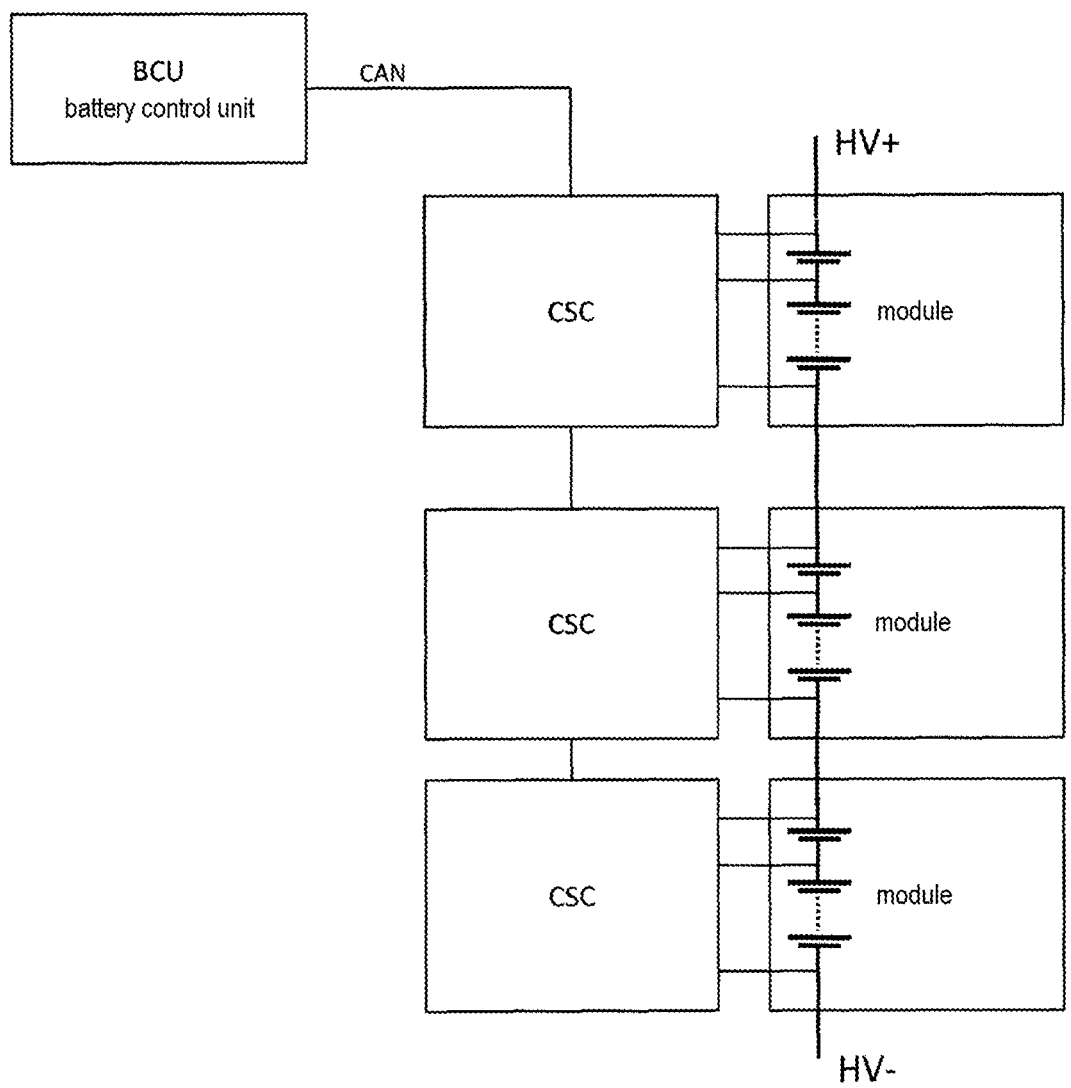
FIG. 1 shows a sketch of a cell assembly having a passive balancing circuit. The balancing charge flowing in the cell i upon the actuation of the balancing circuit can be defined as $Q_i = \int I_i(t)\,dt = \int U_i(t)/R\,dt$.
Figure 2:
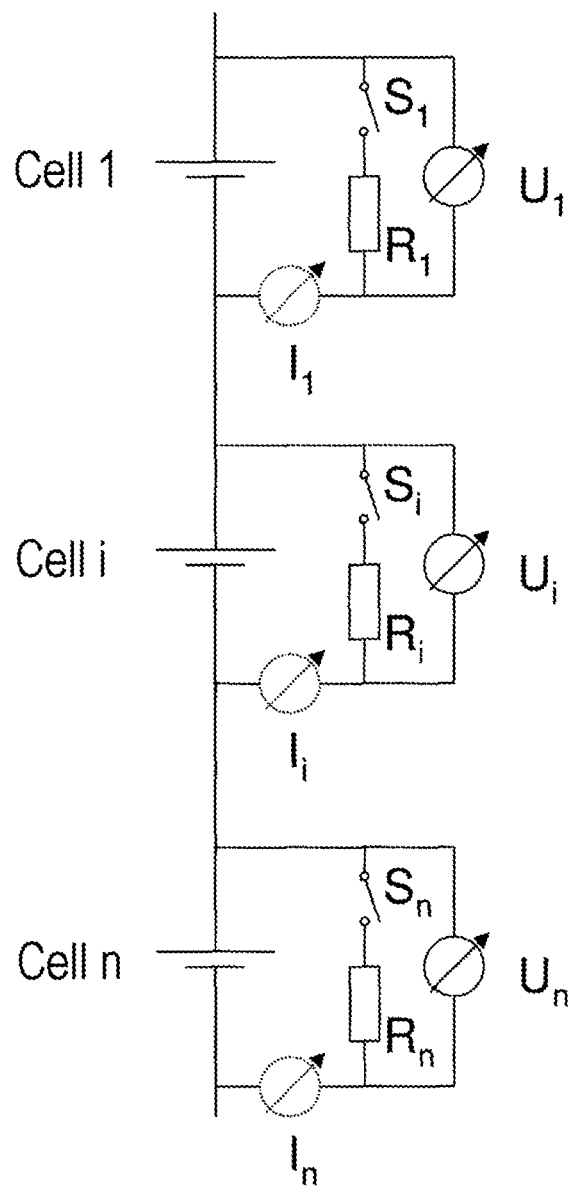
FIG. 2 shows a schematic representation of the layout of a battery system in which the method according to the invention can be implemented.
Figure 3:
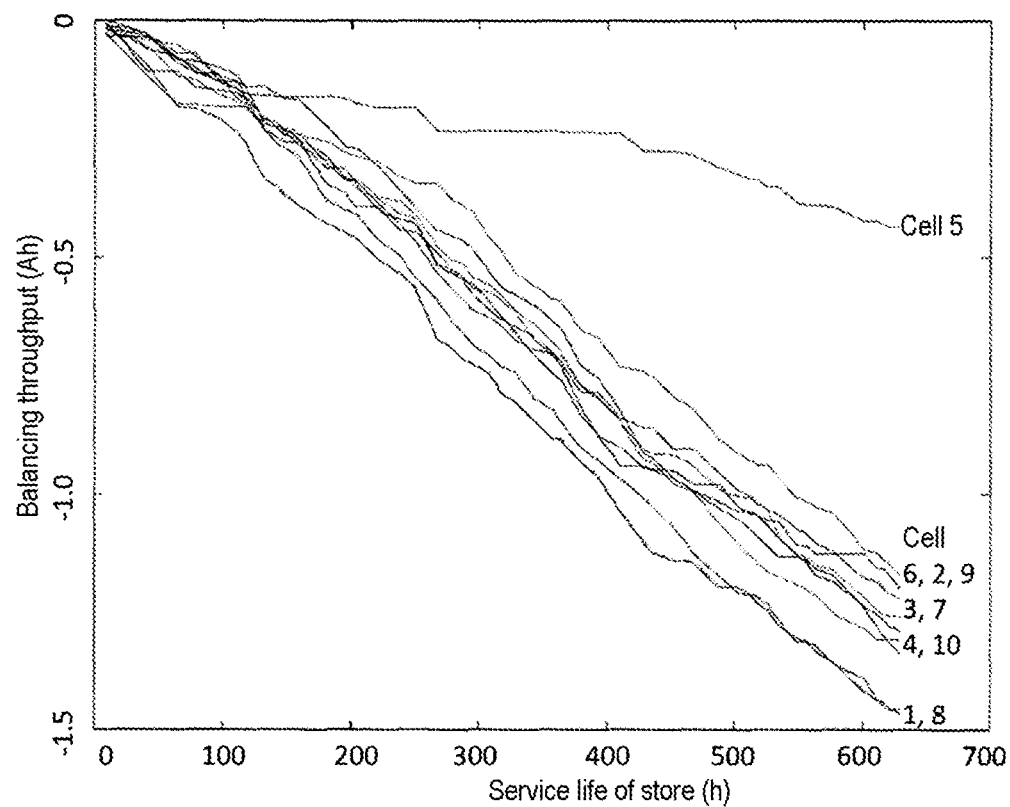
FIG. 3 shows a characteristic for the cumulative total balancing charge in an assembly of 10 cells, plotted against time. After the tenth cycle, cell 5 shows an increase in self-discharging by a factor of 2.5.

In the simplest case of passive balancing, charge is simply drawn from the cell having a raised cell voltage (and thus an increased state of charge) and is dissipated in a load resistor (shunt). A simplified schematic representation of a passive balancing circuit of this type for a number N of series-connected cells is represented in FIG. 1. For each cell i, the cell voltage $U_i$ is monitored by the BMS. Moreover, each cell is provided with a shunt circuit, which comprises at least one switch $S_i$ (e.g., a MOSFET), which is controlled by the BMS, and the actual parallel resistor (or shunt) $R_i$.

A facility for the direct measurement of the balancing current $I_i$, as represented in the figure for illustrative purposes, is typically omitted in practice, in order to minimize the complexity of equipment. Instead, the balancing current is calculated from the resistance value and the voltage characteristic $U_i(t)$ measured during balancing, by the relationship $I_i(t)=U_i(t)/R$. The charge flux is determined by integration over time.

In the event of the detection of a raised SoC, or of an increased voltage in comparison with the other cells, the switch $S_i$ is closed by the BMS, for the purposes of balancing, and the balancing current $I_i$ flows, which is converted into heat in the resistor $R_i$. By this method, the cell is discharged in a controlled manner by means of the shunt circuit, until the voltage $U_i$ achieves the target value. The switch $S_i$ is then re-opened, and the shunt circuit is disconnected from the cell.

In the case of active balancing, charge is drawn from a cell and is fed to another cell. The transfer of charge is executed by means of a switchable component, which functions as an intermediate energy store. A capacitor, a coil, a transformer or a voltage converter (switching controller) can be employed for this purpose.

In the simplest case, this involves a switchable capacitor, which is cyclically charged from a cell having a high SoC (and a high voltage), is switched over, and is discharged to a cell having a low SoC (and a low voltage). The balancing charge can be determined from the respective voltage, the capacitance of the capacitor and the switching frequency. The same principle also applies analogously to other and/or more complex active balancing systems, including those having inductive components (coils, transformers) or switching controllers by way of transmission elements. In each case, the balancing charge can be determined from the voltage on the participating cells, the switching frequency and characteristic data for the respective transmission element. Characteristics of the active balancing circuit are typically known beforehand and are saved in the BMS, such that the balancing charge which is drawn from a cell i and the balancing charge which is fed to a cell j can be determined from the voltage characteristic and the duration of actuation of the balancing circuit.

Method

The method according to the invention comprises the following steps (1), (2) and/or (3) and (4):
(1) Determination of the charge $q_i$ which, in the event of an actuation of the balancing circuit is drawn from or fed to each cell or cell group in a balancing operation (where i=1 N, wherein N represents the number of cells or cell groups);
(2) Determination of the total balancing charge $Q_{tot,i}$ for each cell or cell group by the accumulation of the charge determined in step 1:

$$Q_{tot,i}=\Sigma_x q_{i,x}$$

wherein x=1 n is the numerical variable for the $x^{th}$ actuation of the balancing circuit, and n represents the total number of previous actuations for the respective cell or cell group i;
(3) Determination of the balancing rate $dq_i/dt$ as a quotient of the charge $q_i$ measured in step 1 and the time interval $\Delta t$ which has elapsed since the previous actuation of the balancing circuit;
(4) Diagnosis of abnormally high self-discharging in the cell or cell group i where $Q_{tot,i}$ or $dq_i/dt$, in consideration of the criteria described hereinafter, are too low.

Step (1) comprises the determination of the charge $Q_i$ which is drawn from each cell or cell group i during a balancing process and, in the event of active balancing, optionally also fed to each cell or cell group i by the BMS, as described above. In the event of an infeed of charge, the symbol is inverted. The following description uniformly refers to a drawn charge, wherein an infeed of charge is equivalently considered as a drawn charge having an inverted symbol.

According to step (2), the charge $q_i$ transferred for each cell or cell group i during an individual balancing operation can be accumulated. In the simplest case, it is sufficient that the current accumulated value $Q_{tot,i}$ is saved in each case. The age of the cell $t_{tot,i}$ is also known, such that a quotient $Q_{tot,i}/t_{tot,i}$ can be determined which represents the total balancing charge per unit of time. Alternatively, the respective accumulated values for $Q_{tot,i}$ can also be recorded over time for each balancing operation.

According to step (3), alternatively or additionally to the total balancing charge, the balancing rate $dq_i/dt$ can also be determined. This constitutes a quotient of the charge transferred during balancing and the time interval $\Delta t$ between two balancing operations. As the balancing rate, in practice, is subject to relatively large fluctuations, an average value is preferably employed for diagnostic purposes, for example, an overall average value for the lifetime of the cell, or a sliding average value, wherein averaging is executed over values for a preceding time period (e.g., 2 to 10 days), or values, e.g., for the most recent 2 to 10 balancing operations.

With reference to the total balancing charge and/or the balancing rate thus defined, it is then determined, in step (4), whether abnormally high self-discharging is present. Ultimately, a criterion for this purpose is an excessively low drawn charge, in comparison with the remaining cells or with the total balancing charge. If, for the balancing of the cell, it has been necessary to draw a lower charge than for the remaining cells, which are otherwise subject to the same conditions, this indicates that the self-discharging thereof must have been higher. Additionally, an abnormally high total balancing charge can be interpreted per se as an indication of excessive self-discharging, although any assignment thereof to individual cells is not possible in this case.

Diagnostic Criteria

In step (4), with reference to the total balancing charge and/or the balancing rate previously determined in step (2) or (3), those cells are identified in which the balancing charge drawn is abnormally low. To this end, according to the invention, one or more of the following criteria can be employed:

(a) $Q_{tot,i}/t_{tot,i}$ undershoots a predefined threshold value $Q_{ref}/t_{tot}$, wherein $t_{tot,i}$ represents the age of the cell or the cell group i;

(b) $Q_{tot,i}/t_{tot,i}$ undershoots a value averaged over all the cells or cell groups, or over all the cells or cell groups excluding i, by a predefined threshold value $\Delta Q$;

(c) $dQ_{tot,i}/dt$, obtained by recording the values determined in (2) over time and the derivative thereof over time, undershoots a predefined threshold value $Q'_{ref}$;

(d) The average value of $dq_i/dt$, obtained by averaging over all the values determined over the course of time in step (3), undershoots a predefined threshold value $q'_{tot,ref}$;

(e) The sliding average value of $dq_i/dt$, obtained by averaging over those values determined in step (3) which date back over a maximum predefined interval, undershoots a predefined threshold value $q'_{ref}$;

(f) The variation in the balancing rate $dq_i/dt$, obtained by recording the values determined in (3) over time and the derivative thereof over time, undershoots a predefined threshold value $q''_{ref}$.

As the accumulated total balancing charge rises proportionally to the age of the cell $t_{tot}$, values for criteria (a) and (b) are respectively to be divided by $t_{tot}$; $t_{tot}$ can represent the absolute age of the cell (e.g. in days since entry into service) or the total number of charging cycles already executed.

The threshold value $Q_{ref}$ according to criterion (a) indicates the permissible lower limit for the total balancing charge per cell i. As indicated, this value is to be scaled in relation to the age of the cell $t_{tot}$.

For example, the threshold value can be determined by the execution of field tests upon a battery system of the same type as that in which the method according to the invention is to be executed, and the recording of the balancing charge. As anomalies in the balancing charge which are indicative of increased self-discharging are expectedly rare, it is also conceivable for the threshold value to be determined by recording the balancing charge of the battery system itself. Optionally, it is necessary for values thus obtained for a specific battery system to be verified by comparison with other battery systems of the same design. Thereafter, the average value and the distribution of the balancing charge over the individual cells can be calculated. The threshold value can be determined, wherein a specific multiple of the distribution width is subtracted from the average value.

Additionally, in the definition of the threshold value, further external factors which are known to the battery management system (BMS), or which can be evaluated on the basis of further measured variables, can be incorporated. For example, in this manner, a natural increase in self-discharging associated with ageing processes, such as SEI build-up, can be taken into consideration, wherein the threshold value is modified in accordance with the anticipated state of health. On the grounds of the ultimate input impedance of connected measuring electronics, discharging by means of creepage currents can also occur, which can also be taken into account in the constitution of the threshold value.

According to criterion (b), $Q_{tot,i}t_{tot,i}$ is compared with the average for all the cells, or for all the remaining cells other than cell i. If the value for cell i undershoots this average by a predefined threshold value $\Delta Q$, this can also be indicative of excessively high self-discharging. $\Delta Q$ can be determined, for example, from the width or the standard deviation $\delta$ of the distribution of $Q_{tot,i}/t_{tot,i}$ over all the cells. In the interests of preventing false positive results, $\Delta Q$ in this case is preferably at least $1.5\sigma$, wherein at least $2\sigma$ is further preferred, and at least $3\sigma$ is particularly preferred. In order to prevent false negative results, it is further preferred that $5\sigma$ is not exceeded. The determination of $\Delta Q$ as a multiple of the distribution width provides an advantage, in that this can be executed in situ on the basis of established data, and no reference data are required.

According to (c), a further criterion is the rate of variation of the total balancing charge $dQ_{tot,i}/dt$. This can be obtained by the recording over time of the total balancing charge values $Q_{tot,i,x}$ determined in step (2) of each balancing operation, wherein x is the numerical index for actuations of the balancing system. By the application of an analytical fit curve (e.g. a polynomial) and the constitution of a temporal derivative, $dQ_{tot,i}/dt$ can be determined. If the rate of variation in the total balancing charge declines over time, this is also an indication of increased self-discharging. As a criterion, in turn, an undershoot of a threshold value $Q'_{ref}$ is employed, which can be determined in turn from the abovementioned $Q_{ref}$ by the constitution of the derivative.

Consideration of the rate of variation provides an advantage, in that static effects such as measuring currents of different magnitude associated with a minor difference in the input impedance of measuring electronics, which can also result in a different balancing charge, but which are constant over time, can be eliminated, and only the variation (increase) in the self-discharging of cells is considered.

Alternatively or additionally to the total balancing charge, the balancing rate $dq_i/dt$ can also be considered as a criterion. This can be determined as a quotient of the charge determined in step (1) and the time interval between two actuations of the balancing system. As the individual values thus obtained can typically be subject to relatively large fluctuations, an average value is firstly calculated (criterion (d)). This, in turn, is compared with a threshold value $q'_{ref,tot}$, which can be obtained e.g. in an analogous manner to $Q_{ref}$, or is calculated from $Q_{ref}$ by the constitution of the temporal derivative.

Alternatively to the overall average value, according to criterion (e), a sliding average value can also be determined, for example as an average of the last 2 to 10 actuations of the balancing system, or as an average of balancing operations which date back within a specific time period, e.g., 1 to 20 days. The sliding average value, in turn, is compared with a threshold value $q'_{ref}$.

Finally, according to criterion (f), the temporal characteristic of the balancing rate can also be considered, which corresponds to the second temporal derivative of the balancing charge $q_i$. A decline in the balancing rate over time which undershoots a predefined threshold value $q''_{ref}$ is also indicative of increased self-discharging.

Implementation

The measurement, recording and evaluation of data in steps (1) to (4), as described, is executed by the BMS, wherein the exact nature of implementation and the control devices employed are not subject to any specific limitation. These functions can preferably be assumed by control devices which, in any event, are present in the battery system.

In the simplest case, the BMS is implemented in the form of a single control device (battery control unit, or BCU), which monitors operating data for all the cells, either simultaneously or sequentially, using a multiplex method. Cells can also be interconnected in groups to constitute modules. In this case, all monitoring and control functions are executed by the BCU such that, appropriately, the method according to the invention is also executed in the BCU.

Alternatively, a dedicated control device (cell monitoring unit, cell supervision circuit, or CSC) can be provided for each module or each cell, which monitors the cells at a modular level and transmits data recorded to the BCU via a communication system (e.g., a CAN bus). An arrangement of this type is represented in FIG. 1.

If CSCs are correspondingly equipped with regard to available memory and computing capacity, all the process steps (1) to (4), including the optional temporal recording of data, can be executed on the CSCs, which are then only required to communicate the presence or absence of cells having increased self-discharging to the BCU. Alternatively, the calculation of charge (1) and, optionally, the accumulation (2) per cell can be executed on the CSCs, wherein the BCU assumes recording over time, the constitution of the derivative (3) and the evaluation function (4). In a further alternative, the CSCs only communicate the temporal voltage characteristic during balancing to the BCU, on which the actual process steps (1) to (4) are then executed.

If cells having an abnormal self-discharge are detected, various responses are possible, depending upon previous history and/or the magnitude of the deviation from the anticipated value. In the event of one-off or sporadic deviations, a simple entry in the error log of the BCU can be completed, which marks up the cell for inspection during the next servicing of the battery system. In the event of frequent and stronger deviations, the cell can be marked up e.g. for prompt replacement, and the BMS transmits a message to this effect via a communication channel (e.g., a CAN bus) to the system in which the battery system is installed (e.g., an electrically powered vehicle). In the worst case, in the event of major deviations from the target value and/or deviations of increasingly greater magnitude, the BMS can additionally shut down the cell, or the module in which the cell is installed, in order to prevent any further deterioration and the occurrence of an internal short-circuit.

What is claimed is:

1. A method for detecting abnormal self-discharge in a battery system which includes a plurality of lithium ion cells and a battery management device, wherein the lithium ion cells are respectively provided with a balancing circuit, either individually or in groups, the method comprising:

actuating the balancing circuit of a first cell or a first cell group at a predefined time point, a cell voltage of the first cell or the first cell group being higher than a cell voltage of a second cell or a second cell group, in order to draw charge from the first cell or the first cell group and to feed the charge drawn from the first cell or the first cell group to the second cell or the second cell group having a lower cell voltage, until the cell voltage of the first cell or the first cell group and the cell voltage of the second cell or the second cell group are equalized;

(1) determining a charge $Q_i$ which is drawn from or fed to each cell or cell group in a balancing operation (where $i = 1 \ldots N$, wherein N represents a number of cells or cell groups) during the actuating of the balancing circuit;

(2) determining a total balancing charge $Q_{tot,i}$ for each cell or cell group by an accumulation of the charge $Q_i$ determined in step 1:

$$Q_{tot,i} = \Sigma_x Q_{i,x}$$

wherein $x = 1 \ldots n$ is the numerical variable for an $x^{th}$ actuation of the balancing circuit, and n represents a total number of previous actuations for a respective cell or cell group i;

(3) determining a balancing rate $dQ_i/dt$ as a quotient of the charge $Q_i$ determined in step 1 and a time interval $\Delta t$ which has elapsed since a previous actuation of the balancing circuit;

(4) diagnosing an abnormally high self-discharging in a cell or a cell group i where $Q_{tot,i}$ or $dQ_i/dt$ fulfils at least one of a following criteria:

(a) $Q_{tot,i}/t_{tot,i}$ undershoots a predefined threshold value $Q_{ref}/t_{tot}$, wherein $t_{tot,i}$ represents an age of the cell or the cell group i, $Q_{ref}$ represents a lower limit for a total balancing charge per cell, and $t_{tot}$ represents an average age of the cells or cell groups;

(b) $Q_{tot,i}/t_{tot,i}$ undershoots a value averaged over all of a plurality of cells or cell groups, or over all the plurality of cells or cell groups excluding the cell or the cell group i, by a predefined threshold value $\Delta Q$;

(c) $dQ_{tot,i}/dt$, obtained by recording values determined in (2) over time and a derivative thereof over time, undershoots a predefined threshold value $Q'_{ref}$;

(d) an average value of $dQ_i/dt$, obtained by averaging over all the values determined over a course of time in step (3), undershoots a predefined threshold value $q'_{tot,ref}$;

(e) a sliding average value of $dQ_i/dt$, obtained by averaging over those values determined in step (3) which date back over a maximum predefined interval, undershoots a predefined threshold value $q'_{ref}$;

(f) a variation in the balancing rate $dQ_i/dt$, obtained by recording the values determined in (3) over time and the derivative thereof over time, undershoots a predefined threshold value $q''_{ref}$;

wherein the balancing circuit is a passive balancing circuit, which comprises a switch and a load resistor $R_i$, and the charge flowing through the load resistor $R_i$ is defined as $Q_i = \int U_i(t_i)/R_i dt_i$, wherein $U_i(t_i)$ is the first cell voltage during the actuation of the balancing circuit and $t_i$ is an actuation time.

2. The method according to claim 1, wherein each cell is provided with a balancing circuit.

3. The method according to claim 1, wherein both the total balancing charge $Q_{tot,i}$ and the balancing rate $dQ_i/dt$ are defined.

4. The method according to claim 1, wherein values defined for $Q_{tot,i}$ or $dQ_i/dt$ in steps (2) and/or (3) are recorded over time.

5. A battery system having the plurality of lithium ion cells and a battery management device,
wherein the battery management device is configured to execute the method according to claim 1.

* * * * *